United States Patent [19]
Hutson

[11] 3,918,082
[45] Nov. 4, 1975

[54] SEMICONDUCTOR SWITCHING DEVICE

[76] Inventor: Jearld L. Hutson, 907 Newberry, Richardson, Tex. 75080

[22] Filed: Nov. 7, 1973

[21] Appl. No.: 413,539

[52] U.S. Cl. ........................ 357/38; 357/20; 357/39; 357/45; 357/55; 357/86; 357/89
[51] Int. Cl. ................................................ H01l 11/10
[58] Field of Search ............... 317/235 AE, 235 AB; 357/20, 38, 39, 45, 55, 86, 89

[56] References Cited

UNITED STATES PATENTS

| | | | |
|---|---|---|---|
| 3,277,352 | 10/1966 | Hubner | 317/234 |
| 3,360,696 | 12/1967 | Neilson et al. | 317/235 |
| 3,476,992 | 11/1969 | Chu | 317/235 |
| 3,622,845 | 11/1971 | McIntyre et al. | 357/38 |
| 3,634,739 | 1/1972 | Borchert et al. | 357/38 |
| 3,792,320 | 2/1974 | Hutson | 357/39 |
| 3,794,890 | 2/1974 | Weimann et al. | 317/235 R |

*Primary Examiner*—Andrew J. James
*Assistant Examiner*—Joseph E. Clawson, Jr.
*Attorney, Agent, or Firm*—Richards, Harris & Medlock

[57] ABSTRACT

The specification discloses a semiconductor device including a body of semiconductor material formed of at least three layers of one and the opposite conductivity type of semiconductor material interleaved with one another to define a plurality of P-N junctions. A plurality of discrete regions of one conductivity type are formed in one of the exterior layers of the other conductivity type. The discrete regions extend normally from the external surface of the layer into the interior of the layer and are closely spaced apart throughout the surface of the exterior layer to cause voltage drops which are normal to the P-N junctions during conduction of the device. First and second electrodes are spaced apart on the exterior layer and a third electrode is connected to the other of the exterior layers of the other conductivity type.

14 Claims, 6 Drawing Figures

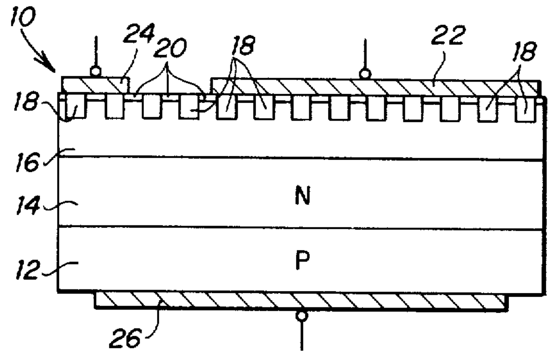
FIG. 1
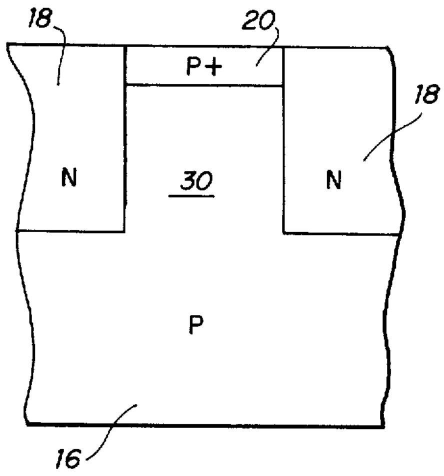
FIG. 2
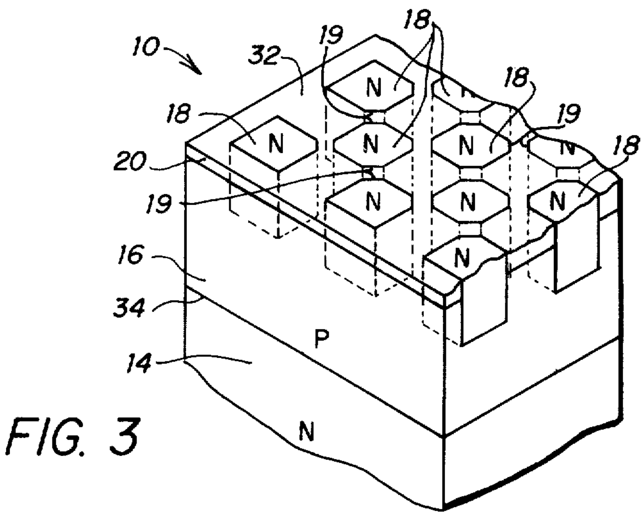
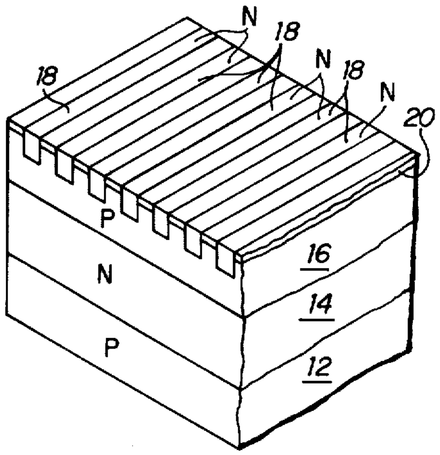
FIG. 4
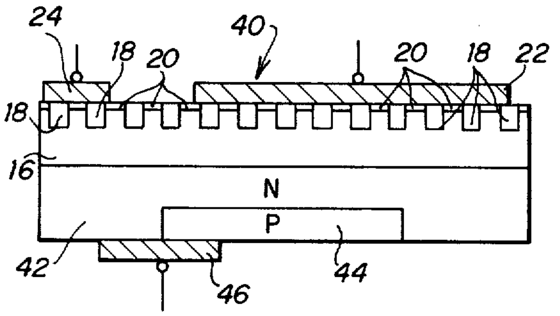
FIG. 5
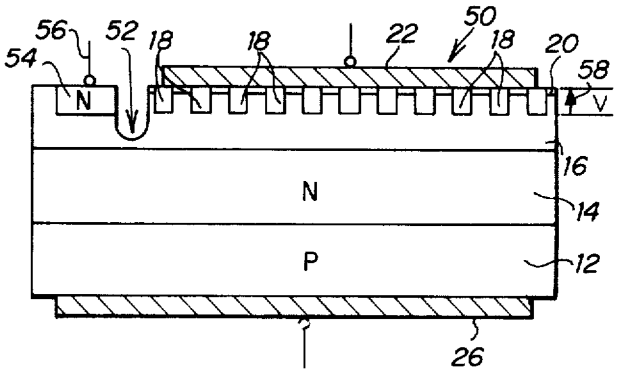
FIG. 6

SEMICONDUCTOR SWITCHING DEVICE

FIELD OF THE INVENTION

This invention relates to semiconductor switching devices, and more particularly relates to semiconductor switches of the multilayer type.

THE PRIOR ART

A wide variety of different types of multilayer semiconductor switching devices have been heretofore developed. For example, a four layer P-N-P-N three terminal device termed a silicon controlled rectifier (SCR) is commonly used in control applications and is described in detail in Chapter 1 of the General Electric Controlled Rectifier Manual, Second Edition, Copyright 1961 by the General Electric Company, and in the article by Moll, Tanenbaum, Goldey and Holonyak in Proceedings of the IRE, September 1956, Volume 44, pages 1174–1182. In addition, improvements in the multilayer SCR are described in U.S. Pat. No. 3,476,993 issued to Aldrich, et al. on Nov. 4, 1969, and in U.S. Pat. No. Re. 27,120 issued to Moyson on Apr. 27, 1971.

Each of the foregoing disclosed SCRs generally comprises a four layer P-N-P-N three terminal device having an emitter region located on a side. The device is made an active element in a circuit by connecting two of its three terminals (the anode and cathode terminals) in the circuit to be controlled. When the switch is in its "off" condition, the device acts as a high impedence element. When the switch is rendered conductive by the introduction of current into the third terminal (the triggering or gate terminal), the device is rendered conductive and then presents a very low impedence.

An important aspect of operation of each of the previously developed SCRs during initial conduction is a lateral voltage drop which is parallel to the emitter junction of the device. This lateral voltage drop is primarily caused by the nonuniform emitter geometry which results in lateral flow of carriers during initial conduction of the device. The lateral voltage drop in some instances causes lower than optimum static and commutating dv/dt characteristics for the SCR device, and also tends to result in a turnoff time which is longer than desired. A need has thus arisen for a semiconductor switching device with improved dv/dt characteristics and turn off time.

SUMMARY OF THE INVENTION

In accordance with the present invention, a semiconductor device is provided which substantially reduces or eliminates many of the disadvantages heretofore associated with prior multilayer semiconductor switches. In the present invention, the lateral voltage drop of prior multilayer semiconductor switching devices having shorted emitter design is substantially eliminated and a voltage drop extending normal to the emitter junction, termed a vertical voltage drop, is provided which operates to provide improved operating characteristics to the device.

In accordance with a more specific aspect of the invention, a semiconductor device is provided which includes a body of semiconductor material having at least three layers including an internal layer of one conductivity type bounded on opposite sides by two layers of the opposite conductivity type to form a plurality of P-N junctions and first and second opposed outer surfaces of the opposite conductivity type. A plurality of discrete regions of the one conductivity type are closely spaced apart over the first outer surface of the body. The discrete regions have generally symmetrical cross sections and extend inwardly from the first outer surface into the interior of one of the layers of opposite conductivity type. A first large area electrode is placed in low resistance ohmic contact with the exposed surfaces of a plurality of the discrete regions and with a portion of the first outer surface. A second electrode is connected to the first outer surface and is spaced apart from the first electrode such that at least one vertical P-N junction exists between the first and second electrodes. A third electrode is connected to the second outer surface.

In accordance with another aspect of the invention, a semiconductor device comprises a body including three layers of one and the opposite conductivity type of semiconductor material. A layer of one conductivity type is disposed between exterior layers of the other conductivity type to form a plurality of P-N junctions within the body. A plurality of discrete regions of the one conductivity type are formed in one of the exterior layers and extend normally from the external surface into the interior of the exterior layer. The discrete regions are closely spaced apart throughout the exterior layer to cause a voltage drop adjacent the region which is normal to the P-N junctions during initial conduction of the device. First and second spaced apart electrodes are connected in low resistance ohmic contact with the discrete regions and the exterior layer and a third electrode is connected to the other of the exterior layer of the other conductivity type.

In accordance with yet another aspect of the invention, a semiconductor device includes a body of semiconductor material having a plurality of interleaved layers of opposite semiconductor material type to form a plurality of P-N junctions. A plurality of discrete regions of semiconductor material of one conductivity type are formed in an exterior layer of the opposite conductivity type and extend from the external surface normally into the interior of the layer. The regions are closely spaced apart over the surface area of the exterior layer with narrow intervals of the opposite conductivity type disposed between and surrounding the regions. First and second electrodes contact the exterior surface and ones of the regions and are spaced apart by at least one of the intervals of the opposite conductivity type. A third electrode is connected to the other exterior layer of semiconductor material of the body.

DESCRIPTION OF THE DRAWINGS

For a more complete understanding of the present invention and for further objects and advantages thereof, reference is now made to the following description taken in conjunction with the following drawings, in which:

FIG. 1 is a somewhat diagrammatic sectional view of one embodiment of a semiconductor switching device according to the invention;

FIG. 2 is an enlarged sectional view taken between two of the discrete regions of the device shown in FIG. 1;

FIG. 3 is an enlarged perspective view of a cut-away portion of the upper surface of the device shown in FIG. 1;

FIG. 4 is an illustration of an alternate embodiment of the invention;

FIG. 5 is a somewhat diagrammatic side sectional view of another embodiment of the invention; and FIG. 6 is a side sectional view of another embodiment constructed according to the invention.

DESCRIPTION OF THE PREFERRED EMBODIMENT

FIG. 1 illustrates a side view of an embodiment of a three terminal controlled rectifier-type device constructed according to the invention. A body 10 includes a first exterior P-type layer 12 having an external surface, an interior N-type layer 14 and another exterior P-type layer 16. A large number of discrete regions 18 of N-type material are formed in the P-type layer 16. In the illustrated embodiment, each of the regions 18 has a width less than 25 mils, and in the preferred embodiment each region 18 has a width of less thana 10 mils. Each of the regions 18 has a generally square cross section and extends from the outer exterior surface of layer 16 downwardly into the interior of layer 16, but does not extend into contact with the N-type layer 14. As will be subsequently described in detail, regions 18 prevent the occurrence of major lateral voltage drops in the device during initial conduction.

A thin layer of P+ material 20 is disposed over the exterior surface of layer 16 and completely surrounds and isolates the upper regions of each of the regions 18. As will be subsequently described, the P+ layer 20 has a high resistivity relative to the regions 18 and thus tends to isolate the regions 18 from one another. A first relatively wide area electrode 22 is formed over a large area of the surface of the P+ layer 20 and contacts the ends of ones of the regions 18. A second electrode 24 is spaced apart from electrode 22 and is placed in low ohmic resistance contact with a plurality of regions 18 and portions of layer 20. An important aspect of the invention is that the electrodes 22 and 24 are spaced apart a sufficient distance in order to isolate the electrodes from one another. In the preferred embodiment, electrodes 22 and 24 should be spaced apart by at least one of the intervals of P-type material which separates the regions 18, or at least by one of the vertical P-N junctions formed by the regions 18 and the layers 16 and 20. A third electrode 26 is formed on the opposite face of the body 10 and contacts the exterior surface of the P-type layer 12.

FIG. 2 is an enlarged, somewhat diagrammatic, view of a section through two N-type regions 18 and illustrates how the regions 18 are separated by a thin interval 30 of P-type material. FIG. 2 also illustrates the thin layer 20 of P+ material which covers layer 30 and which extends between and surrounds each of the regions 18.

FIG. 3 is a perspective view of an enlarged portion of the upper surface of the body 10, with the electrodes 22 and 24 removed for clarity of illustration. As shown in FIG. 3, the regions 18 in the preferred embodiment have generally symmetrical square cross sections and are spaced equi-distantly apart in a "checkerboard manner" throughout the entire upper surface of the body 10. The regions 18 include beveled corners 19 in order to completely surround the regions 18 with the layers 20 and 16 and regions 18 are therefore isolated from one another. The longitudinal axis of each of the regions 18 is directed normal to the planar exterior surface 32 and to the P-N junction 34 formed by the layers 14 and 16. Although the regions 18 are illustrated as having a generally square cross section, it will be understood that other cross sections can also be utilized. The regions 18 extend from the exterior surface 32 of the body 10 downwardly into the interior of layer 16, but do not extend into contact with layer 14.

The device illustrated in FIGS. 1–3 may be formed with conventional techniques. For example, in an exemplary technique, a body of silicon semiconductor material of N-type conductivity is diffused with an acceptor material such as gallium to form the P-type layers 12 and the layer 16 is then masked and the regions 18 are subsequently diffused therein.

Alternatively, an exterior surface of the body of silicon may be covered with a suitable mask and the surface oxidized at high temperatures, with the areas defining the regions 18 being protected from oxidation by the mask. The resultant body may then be placed in an evacuated sealed tube with an alloy source such as silicon, gallium and phosphorous therein. The temperature of the body may Centigrade be raised about 1150°–1250° Centrigrade and the temperature of the alloy source raised to from 1000°–1300° Centigrade. Gallium from the source will then diffuse through the unoxidized side of the body to form the P-type layer 12 and will diffuse through the oxide layer, as well as through the unprotected surfaces, to form the P-type layer 16. Phosphorous is incapable of diffusing through the oxide layer and thus diffuses at a slower rate than the gallium only through the unoxidized surface to form the N-type regions 18 by converting the P-type silicon into N-type. The concentrations of the alloy source is controlled so that the phosphorous is able to produce N-type conductivity in previously converted P-type conductivity material and the diffusion is allowed to proceed for a time sufficient to produce the desired depths of penetration to form the layer 16 and the regions 18. The upper portion of the regions 18 may then be masked by a suitable techique and the upper layer of layer 16 is highly doped to form a P+ layer 20 by diffusion of a suitable impurity into the body. Conductive coatings of gold or aluminum may then be evaporated on the external surface of the body 10 to form the electrodes 22, 24 and 26 according to techniques well known in the art. The regions 18 are spaced very close to one another. For example, regions 18 will generally be spaced apart in a range of 1–10 mils, with a spacing of 2–3 mils working well in practice.

Although gallium is noted as being utilized, it will be understood that other conventional types of material such as indium, boron or aluminum could be utilized to provide the P-type diffusion layers noted above.

The surface impurity concentration of the regions 18 and layers 12, 14 and 16 may of course vary according to desired operation of the device. However, a typical impurity concentration of the P+ layer 20 would be on the order to $2 \times 10^{19}$ atoms per cubic centimeter and a typical depth of the layer 20 is on the order of 0.2 mil. P-type layer 16 may have a surface impurity concentration of on the order of $10^{16}$ to $10^{21}$ atoms per cubic centimeter. The N-type layer 14 may have for example a surface impurity concentration of in the range of $10^{13}$ to $10^{15}$ atoms per cubic centimeter. The N-type regions 18 may have for example a surface impurity concentration of $10^{21}$ atoms per cubic centimeter. The depth of the layer 16 may be for example up to 4 mils, with the depth of the N-type regions 18 always being less than the thickness of the layer 16.

Operation of the SCR device shown in FIGS. 1–3 is generally similar to that of the SCR device disclosed in such patents as the Moyson U.S. Pat. No. Re. 27,120, except that the current flow and resulting voltage drop occurring during triggering of the present device is predominately perpendicular to the lateral P-N junction 34, rather than parallel to the lateral emitter junctions as in the prior devices. Assuming that an increasing voltage is applied between electrodes 22 and 26 to render electrode 22 increasingly negative with respect to electrode 26, the emitter junction of the device becomes forwardly biased. In prior art devices, this has created a lateral voltage drop at the emitter junction, but in the present device the regions 18 substantially eliminate or reduce lateral current flow and voltage drop, and the primary voltage drop thus occurs in a direction parallel to the axes of the regions 18 and in a direction normal to the P-N junction between layers 14 and 16. This voltage drop of the present device, which will be henceforth termed a vertical voltage drop, provides substantially improved static and commutating dv/dt. In addition, due to the vertical voltage drop during initial conduction of the device, the turnoff time of the present SCR is substantially decreased.

An important aspect of the device shown in FIG. 1 is that the electrodes 22 and 24 are spaced apart a sufficient distance to enable isolation of the two electrodes from one another. Preferably, the electrodes 22 and 24 will be spaced apart by at least one of the intervals 30 of the P-type material disposed between the regions 18. Such spacing will provide at least one vertical P-N junction between the electrodes 22 and 24.

Although the preferred embodiment is illustrated with discrete regions 18 having square cross sections, it will be understood that different configurations of the emitter regions are possible. For example, FIG. 4 illustrates a device having a plurality of elongated bar discrete regions 18 which extend across the width of the device in a spaced apart parallel configuration. The dimensions and operation of the device of FIG. 4 are similar to the device described in FIGS. 1–3. Other configurations of the discrete regions are also possible, such as a plurality of spaced apart concentric circles, wavy elongated bars, and the like.

FIG. 5 illustrates another embodiment of the invention wherein like numerals are utilized for like and corresponding parts. The device is designated generally by numeral 40 and includes a P-type layer 16 having a plurality of N-type discrete regions 18 spaced apart over the entire surface thereof in the manner previously described. A P+ layer 20 is also formed over the exterior surface of the layer 16 and surrounds the discrete regions 18. Electrodes 22 and 24 are spaced apart in the manner previously described.

In this embodiment, a second layer 42 is disposed between layer 16 and a third layer 44 which is formed by diffusion into layer 42. A third electrode 46 shorts layers 42 and 44. Operation of the device 40 is similar to that previously described, in that during initial conduction of the device, vertical voltage drops occur which are parallel to the longitudinal axes of the elongated region 18 and which are also generally normal to the P-N junction defined by layers 16 and 42. As previously noted, this vertical voltage drop provides improved operating characteristics to the device in providing improved static and commutating dv/dt and improved switching time.

FIG. 6 illustrates another embodiment of the invention wherein like numerals are utilized for like and corresponding parts. FIG. 6 illustrates an SCR-type device 50 including a P-type layer 12 and an N-type layer 14. An electrode 26 is bonded to the exterior surface of the layer 12. A P-type layer 16 forms a P-N junction with layer 14 and a plurality of discrete elongated regions 18 are formed over the majority of the exterior surface of the layer 16. A P+ layer 20 is formed over layer 16 and surrounds regions 18. A first large area electrode 22 is bonded into contact with the exterior surfaces of the regions 18 and with layer 20.

A groove 52 is formed through layer 16 into layer 14 in order to isolate regions 18 and electrode 22 from an N-type region 54 formed by conventional diffusion techniques. An electrode 56 is bonded to the N-type regions 54. Device 50 operates in a similar manner as previously described and the groove 52 isolates the electrode 22 from electrode 56. In triggering operation, the region 54 is initially turned on and causes the remainder of the device to conduct due to the occurrence of voltage drops which are parallel to the longitudinal length of the elongated regions 18 and which are normal to the P-N junction defined by layers 14 and 16. The direction of the voltage drop is illustrated in the drawing by arrow 58. In operation of the device, the magnitude of the vertical voltage drop may be within the range of 0.5 to 1 volt.

The present invention thus defines a semiconductor device having plural layers of opposite types of semiconductor material interleaved with one another to form a plurality of P-N junctions. A plurality of discrete areas of opposite type conductivity are formed in one exterior layer of the device and are spaced closely to one another to substantially eliminate any lateral drops parallel to the P-N junction of the device during initial conduction. Rather, the device provides voltage drops which extend parallel to the longitudinal axis of the elongated regions and which are normal to the P-N junction. These voltage drops, termed vertical voltage drops, provide improved operating characteristics of the device such as improved commutating and static dv/dt and improved turnon time.

It will be understood that the present devices may be formed by a plurality of different conventional techniques and that the processes, dimensions and magnitude provided herein are merely exemplary. In addition, it will be understood that the devices may have rectilinear geometries as well as circular, cylindrical and other geometry. Moreover, while the control regions of the devices have been disclosed as being of N-type conductivity, it will be understood that P-type conductivity control regions may be utilized with the devices wherein the conductivity type of the various regions is reversed to that described. However, such complementary devices will not generally provide the superior operating conditions provided by the above-noted N-type emitter regions. Further, the shape and relative lengths of the regions 18 may be varied according to desired operating characteristics.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor device comprising:

a body of semiconductor material having three layers including an internal layer of one conductivity type bounded on opposite sides by two layers of the opposite conductivity type to form a plurality of P-N junctions, said body having first and second opposed outer surfaces of said opposite conductivity type, an array of discrete regions of said one conductivity type spaced apart over substantially the entire area of said first outer surface of said body, said discrete regions having symmetrical cross sections in planes parallel to said outer surfaces and extending inwardly from said first outer surface into the interior of one of said layers of opposite conductivity type, a layer of highly doped semiconductor material of said opposite conductivity type formed over said first outer surface of said body and extending between and surrounding said discrete regions, a first large area electrode in low resistance ohmic contact with the exposed surfaces of a plurality of said discrete regions and with a portion of said first outer surface, a second electrode connected to said first outer surface and a plurality of said discrete regions and spaced apart from said first electrode such that at least one vertical P-N junction exists between said first and second electrodes, a source of control bias connected to said second electrode, and a third electrode connected to said second outer surface, wherein a voltage drop occurs adjacent said regions which is normal to said outer surfaces during initial conduction of said device upon the application of a predetermined bias potential.

2. The semiconductor device of claim 1 wherein the cross sectional areas of said regions are generally rectangular and said regions are spaced apart over the entire area of said first outer surface with thin intervals of opposite conductivity type disposed between and surrounding each of said regions.

3. The semiconductor device of claim 1 wherein the lengths of said regions along the axes thereof are disposed normal to said outer surfaces.

4. The semiconductor device of claim 1 and further comprising a groove disposed between said first and second electrodes.

5. The semiconductor device of claim 4 and further comprising an area of said one conductivity type formed in said first outer surface and having an area larger than one of said discrete regions, said area spaced on the other side of said groove from said first electrode, and being connected to said second electrode.

6. The semiconductor device of claim 1 wherein said regions are comprised of N type conductivity material.

7. The semiconductor device of claim 6 and further comprising a layer of P+ semiconductor material disposed over said first outer surface and surrounding said discrete regions, the thickness of said layer of P+ material being less than the thickness of said three layers.

8. A semiconductor device comprising:

a body of semiconductor material including a plurality of interleaved layers of opposite semiconductor material type to form a plurality of P-N junctions, an array of elongated discrete regions of semiconductor material of one conductivity type formed in an exterior layer of the opposite conductivity type and extending from the external surface normally into the interior of said layer, said elongated regions having symmetrical cross sections in planes parallel to said external surface and closely spaced apart less than ten mils from one another over the surface area of said exterior layer with intervals of said opposite conductivity type disposed between and surrounding said regions, first and second electrodes contacting said exterior surface and each contacting a group of said regions and spaced apart by at least one of said intervals of said opposite conductivity type, a source of control bias connected to said second electrode, and a third electrode connected to the other exterior layer of semiconductor material of said body wherein a voltage drop occurs adjacent said regions which is normal to said outer surfaces during initial conduction of said device upon the application of a predetermined bias potential.

9. The semiconductor device of claim 8 and further comprising a thin layer of semiconductor material of said opposite conductivity type disposed over said external surface and surrounding said discrete regions.

10. A semiconductor device of claim 9 wherein said thin layer of semiconductor material comprises P+ material.

11. The semiconductor device of claim 8 wherein a voltage drop occurs along the axes of said regions which is normal to said external surface during initial conduction of said device.

12. The semiconductor device of claim 8 and further comprising a groove separating said first and second electrodes.

13. The semiconductor device of claim 8 wherein the width of each of said regions is less than twenty five mils.

14. The semiconductor device of claim 8 wherein the width of each of said regions is less than ten mils.

* * * * *